United States Patent [19]

Ishikawa

[11] Patent Number: 5,723,386
[45] Date of Patent: Mar. 3, 1998

[54] METHOD OF MANUFACTURING A SEMICONDUCTOR DEVICE CAPABLE OF RAPIDLY FORMING MINUTE WIRINGS WITHOUT ETCHING OF THE MINUTE WIRINGS

[75] Inventor: Hiraku Ishikawa, Tokyo, Japan

[73] Assignee: NEC Corporation, Tokyo, Japan

[21] Appl. No.: 674,907

[22] Filed: Jul. 3, 1996

[30] Foreign Application Priority Data

Jul. 4, 1995 [JP] Japan ................................ 7-169097

[51] Int. Cl.$^6$ ................................................. H01L 21/00
[52] U.S. Cl. ........................ 438/787; 438/788; 427/575; 427/579
[58] Field of Search ........................... 437/235, 238, 437/228; 118/723 MP, 723 MW, 723 MR; 427/574, 575, 578, 579, 570, 563; 438/787, 788, 694, 695, 697, 699, 703

[56] References Cited

U.S. PATENT DOCUMENTS

| | | | |
|---|---|---|---|
| 4,732,761 | 3/1988 | Machida et al. | 437/228 |
| 4,891,118 | 1/1990 | Ooiwa et al. | 204/298 |
| 5,322,806 | 6/1994 | Kohno et al. | 437/40 |
| 5,435,886 | 7/1995 | Fujiwara et al. | 156/643.1 |

FOREIGN PATENT DOCUMENTS 2-129375  5/1990  Japan.
4-359515  12/1992  Japan.

OTHER PUBLICATIONS

Journal of Vaccum Society Technology, p. 818, B4(4), Jul./Aug. 1986; 0734-211x/86/040818-04S01.00;SiO$_2$ Planarization Technology With Biasing and Electron Cyclotron Resonance Plasma Deposition for Submicron Interconnections.

*Primary Examiner*—R. Bruce Breneman
*Assistant Examiner*—Luz Alejandro
*Attorney, Agent, or Firm*—Whitham, Curtis, Whitham & McGinn

[57] ABSTRACT

In a method of manufacturing a semiconductor device having a multilayer interconnection structure, when a silicon oxide film is formed onto an electric wiring on a semiconductor substrate by the use of plasma deposition, a first high frequency wave of a constant value is provided for producing plasma while a second high frequency wave of a pulsed amplitude having a predetermined pulse interval and a predetermined rest interval is supplied onto said semiconductor substrate. Silane gas, oxygen gas and argon gas are employed as deposition gases, wherein the argon gas is periodically supplied during a pulsed interval.

15 Claims, 9 Drawing Sheets

METHOD OF MANUFACTURING A SEMICONDUCTOR DEVICE CAPABLE OF RAPIDLY FORMING MINUTE WIRINGS WITHOUT ETCHING OF THE MINUTE WIRINGS

BACKGROUND OF THE INVENTION

This invention relates to a method of manufacturing a semiconductor device, in particular to a method of manufacturing the same which has a multilayer interconnection structure.

It has recently been required that a semiconductor device, such as a transistor, be made minute and rapidly operable. Simultaneously, metal wirings for connecting transistors to each other are made more minute. Further, it is inevitable that the semiconductor device has a multilayer interconnection structure. To solve this problem, an example of a method of forming the minute electric wirings is disclosed in Journal of Vacuum Society Technology, Page 818, B4(4), 1986. The method is one of chemical vapor deposition (CVD), NAMELY, bias-ECR plasma deposition in which a high frequency electric field is applied to a substrate and an electron cyclotron resonance (ECR) is used as a plasma source.

Another examples of such CVD methods are disclosed in Unexamined Japanese Patent Publications, Nos. 129375/1990 and 359515/1992.

However, in the above-mentioned methods of manufacturing semiconductor devices, electric wirings are etched by themselves due to sputter effects of the high frequency electric fields during a formation of the minute electric wirings. As a result, the deposition speed is reduced. An abnormal rise of the substrate temperature is inevitably caused to occur. In contrast, the high frequency electric fields could be reduced so as to prevent the etching of the electric wirings themselves. However, this produces a hollow between the electric wirings.

SUMMARY OF THE INVENTION

It is therefore an object of this invention to provide a method of manufacturing a semiconductor device, in which minute electric wirings are rapidly formed without etching of the electric wirings themselves.

Other objects of this invention will become clear as the description proceeds.

According to this invention, there is provided a method of manufacturing a semiconductor device having a multilayer interconnection structure, the method comprising the steps of: forming a silicon oxide film onto an electric wiring on a semiconductor substrate by the use of plasma deposition; the forming a silicon oxide film step comprising the steps of: providing a first high frequency wave of a constant value for producing plasma; and supplying a second high frequency wave of a pulsed amplitude having a predetermined pulse interval and a predetermined rest interval onto the semiconductor substrate.

The forming a silicon oxide film step may be carried out by a bias electron cyclotron resonance chemical vapor deposition.

The predetermined pulse interval may be between 0.3 seconds and 0.67 seconds while the predetermined rest interval is 1.0 seconds.

The first high frequency wave may be a microwave while the second high frequency wave may be RF bias.

The silane gas, oxygen gas, and argon gas may be employed as deposition gas, the argon gas may be supplied as a pulsed output power.

DESCRIPTION OF THE PREFERRED EMBODIMENTS

Figure 1:
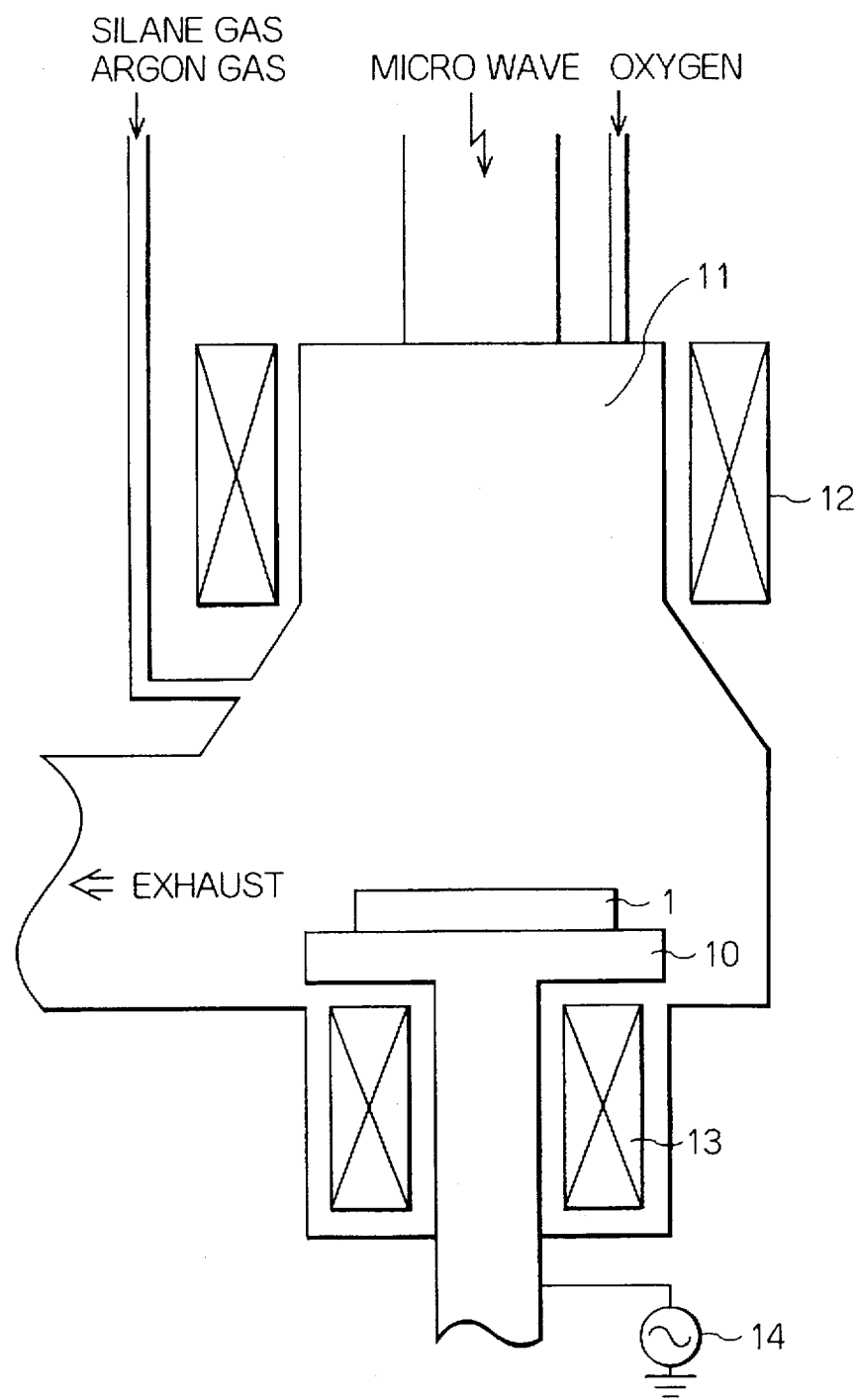
FIG. 1 is a view for describing a structure of a bias ECR-CVD apparatus used in a conventional method of manufacturing a semiconductor device.

Referring to FIG. 1, a conventional method of manufacturing a semiconductor device will first be described for a better understanding of this invention.

In FIG. 1, illustrated is a bias electron cyclotron resonance chemical vapor deposition ("ECR-CVD") deposition apparatus. The bias ECR-CVD deposition apparatus comprises a substrate 1, a susceptor 10 on which the substrate 1 is mounted, a plasma chamber 11, a primary coil 12 located around the plasma chamber 11, an additional coil 13 located around the susceptor 10, and a high frequency power supply 14. A plasma is generated by supplying microwaves onto the substrate 1 in the plasma chamber 11 with a supply of oxygen gas. A film deposition is carried out by the plasma and the silane gas supplied from the near portion of the substrate 1. Simultaneously, a high frequency electric field is applied to the susceptor 10. Thereby, an etching by the plasma of the argon gas is carried out on the substrate 1.

Figure 2:
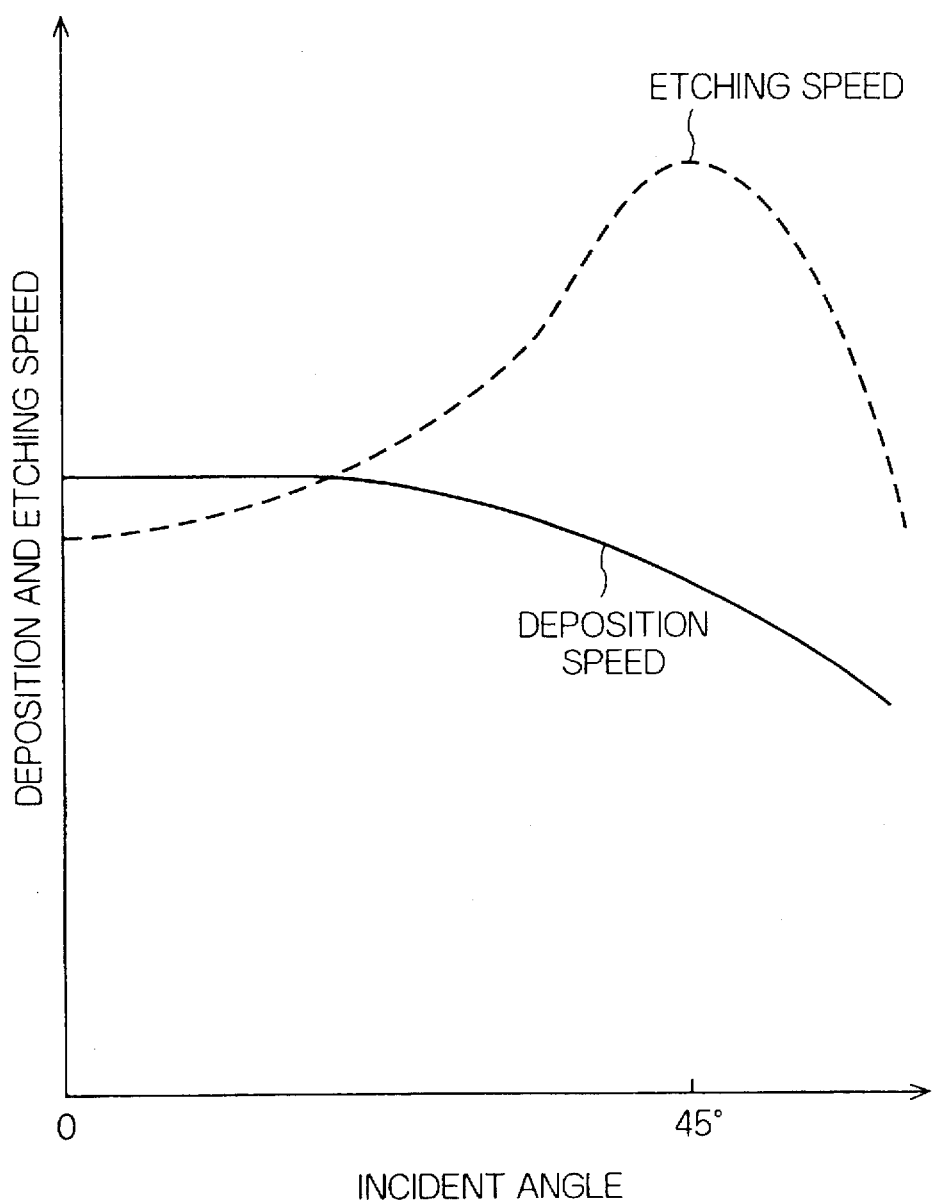
FIG. 2 is a graph for showing a deposition speed and an etching speed with reference to an incident angle in a substrate of the bias ECR-CVD apparatus illustrated in FIG. 1.

Referring now to FIG. 2, description is made about a feature of formation of minute wirings by the use of the bias ECR-CVD deposition method. FIG. 2 is a graph showing the deposition speed and etching speed with reference to an incident angle in the substrate 1 of the bias ECR-CVD apparatus illustrated in FIG. 1.

The deposition speed and the etching speed in the bias ECR-CVD apparatus are independently shown in FIG. 2.

Actually, a true deposition speed is calculated by subtracting the etching speed from the deposition speed. In FIG. 2, zero angle corresponds to an even portion of the electric wiring patterns and a portion where a surface of the substrate 1 is exposed. On the other hand, 45° angle corresponds to a portion of edges of the electric wiring patterns. On the condition that minute wirings are formed, the etching speed is larger than the deposition speed at the portion of edges of the electric wiring patterns.

Figure 3A:
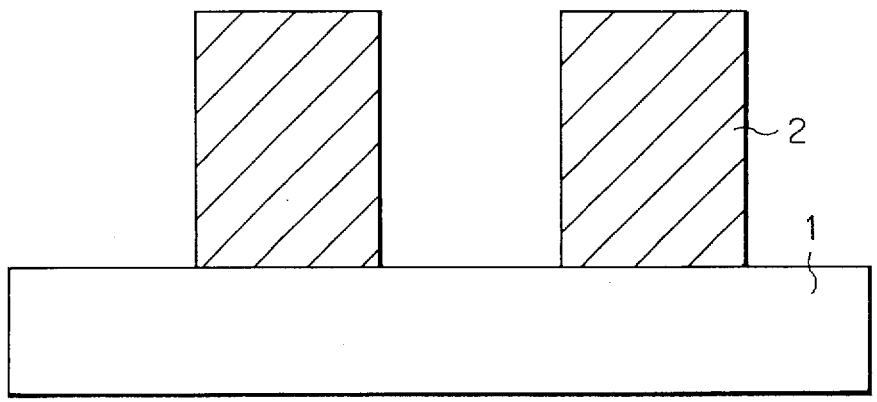
FIGS. 3A and 3B show a view for describing a method of fabricating an inter-layer film in the conventional method of manufacturing a semiconductor device.
Figure 3B:
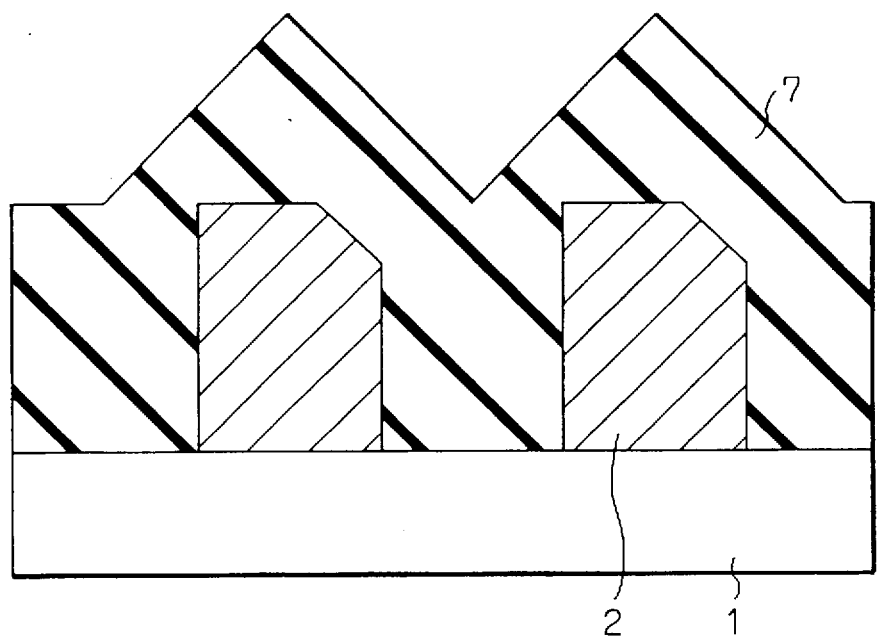

Referring to FIGS. 3A and 3B, description is made about an example of the semiconductor device in which the deposition is carried out on such a condition mentioned with reference to FIG. 2. In FIG. 3B, a silicon oxide film 7 is deposited on a substrate 1 and metal wirings 2 by the bias ECR-CVD method. As will be understood from FIG. 3, the edges of the electric wirings are etched inevitably. On the contrary, when a high frequency electric field is reduced so as to prevent the etching of the edges of the electric wirings, a hollow is inevitably produced between the electric wirings.

However, in the above-mentioned method of manufacturing a semiconductor device, electric wirings are etched by themselves due to sputter effects of the high frequency electric fields during a formation of the minute electric wirings. As a result, the deposition speed is reduced. An abnormal rise of the substrate temperature is inevitably caused to occur. In contrast, the high frequency electric fields could be reduced so as to prevent the etching of the electric wirings themselves. However, this produces a hollow is inevitably produced between the electric wirings.

Figure 4:
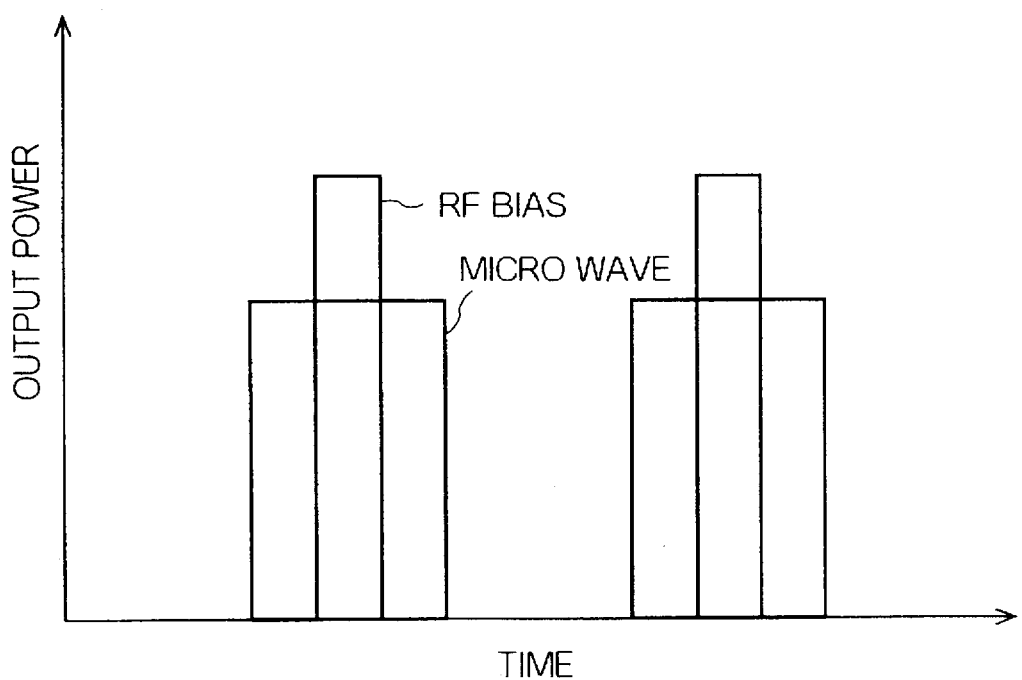
FIG. 4 is a graph for showing a relation between time and output power of a microwave and a high frequency wave in the conventional method of manufacturing a semiconductor device.

Referring to FIG. 4, description proceeds to another conventional method of manufacturing a semiconductor device disclosed in Unexamined Japanese Patent Publication, No. 129375/1990. In the method of manufacturing a semiconductor device, employed is a pulsed microwave having a pulse width of not greater than 5 milliseconds. A pulsed high frequency wave is applied in synchronization with the pulsed microwave in the method of manufacturing a semiconductor device. FIG. 4 is a graph for showing a relation between time and output power of the microwave and the high frequency wave. As shown in FIG. 4, an ion sheath is configured in accordance with unevenness of a surface of a substrate. Accordingly, it is achieved that a uniform deposition is carried out in accordance with unevenness of a surface of a substrate.

However, in this method of manufacturing a semiconductor device, the deposition speed during a term of low output power of the microwaves deteriorates. Further, as high frequency waves are applied in a short time, a sufficient sputter effect cannot be obtained. As a result, a hollow is inevitably produced between the minute electric wirings.

In addition, description is now made about another conventional method of manufacturing a semiconductor device disclosed in Unexamined Japanese Patent Publication, No.359515/1992. In this method of manufacturing a semiconductor device, a plasma emitting intensity onto a surface of a substrate is varied periodically by the use of organic silane and oxygen.

However, in this method of manufacturing a semiconductor device, a characteristic of a film is worse when the surface of the substrate is not subjected to the plasma emitting than when the surface of the substrate is subjected to the plasma emitting. The plasma emitting does not bring about an improvement of a film characteristic sufficiently in a side wall portion of the electric wiring patterns.

Referring to FIGS. 5A to 5D and 6, description will proceed to a method of manufacturing a semiconductor device according to a first embodiment of the present invention.

Figure 5A:
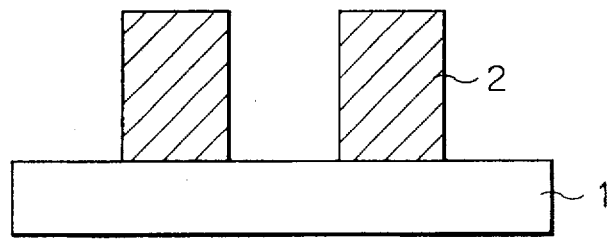
FIGS. 5A to 5D are views for describing a manufacturing process of a method of manufacturing a semiconductor device according to a first embodiment of the present invention.

First, as shown in FIG. 5A, electric wirings 2 are formed on the substrate 1 in a known manner. An insulating film 3 is deposited on the electric wirings 2 by the bias ECR-CVD deposition method. The bias ECR-CVD deposition method is one of the plasma CVD methods in which a high frequency electric field is applied to the substrate 1. Hereinunder, the high frequency electric field is called an radio frequency (RF) bias. Otherwise, the bias ECR-CVD deposition apparatus is similar to that illustrated in FIG. 1 with respect to the conventional method of manufacturing a semiconductor device.

Figure 6:
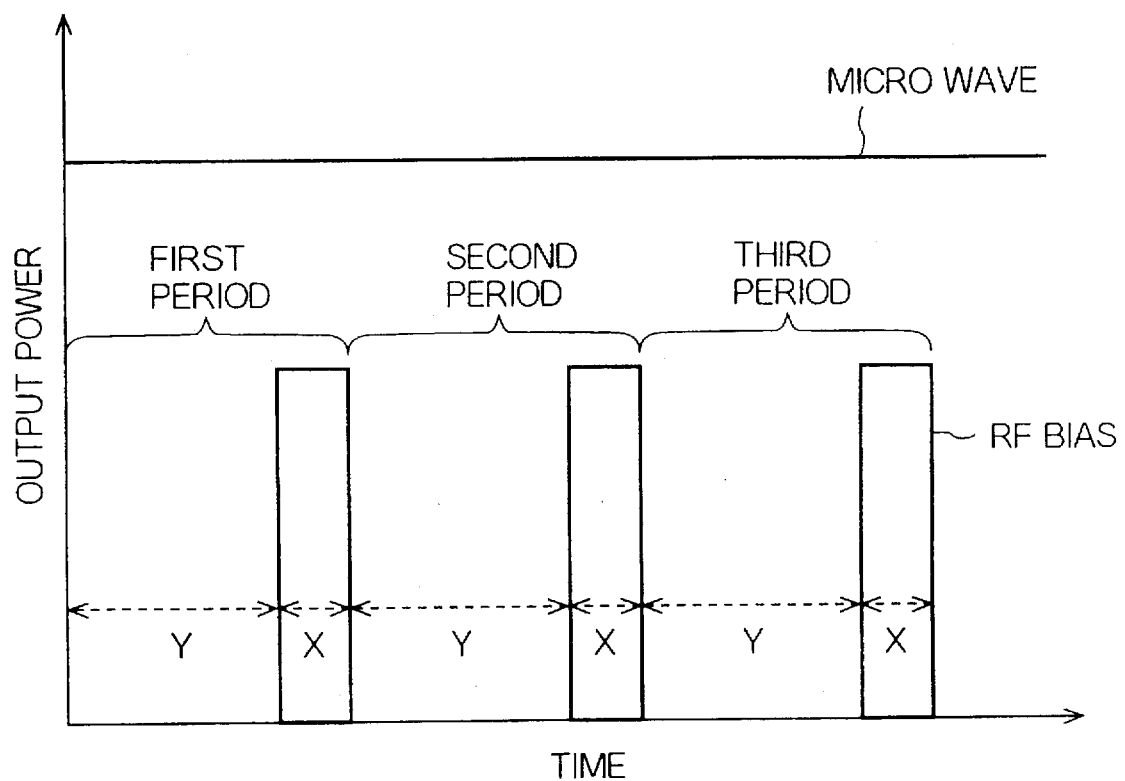
FIG. 6 is a graph for showing a relation between a microwave output, RF bias output and a time for applying the microwave and the RF bias onto a substrate in the method of manufacturing a semiconductor device according to the first embodiment illustrated with reference to FIGS. 5A to 5D.

FIG. 6 is a graph for showing a relation between a microwave output, RF bias output and a time for applying the microwave and the RF bias onto the substrate 1 in the method of manufacturing a semiconductor device according to the first embodiment. As depicted in FIG. 6, the microwave is kept at a constant output power from the beginning to the end of the deposition. On the other hand, the RF bias is applied as a pulsed output power, as illustrated in FIG. 6. In FIG. 6, each pulse interval X is 0.3 seconds provided that each rest interval Y is 1 seconds. Alternatively, each pulse interval X can range from 0.3 seconds to 0.67 seconds provided that each rest interval Y is 1 seconds. When the pulse interval X exceeds 0.67 seconds, the edge portion of the electric wirings are etched unwillingly. On the other hand, when the pulse interval X does not reach 0.3, a hollow is inevitably produced between the electric wirings 2. In FIG. 6, the bias ECR-CVD deposition is carried out on the condition that a throughput of silane gas is 15 to 30 sccm, a throughput of oxygen is 23 to 45 sccm, a throughput of argon gas is 70 to 150 sccm, that an output power of the microwave is 2000 W, an output power of the RF bias is 1400 W to 3000 W, and that a deposition temperature is 300° C. to 350° C.

Figure 5B:
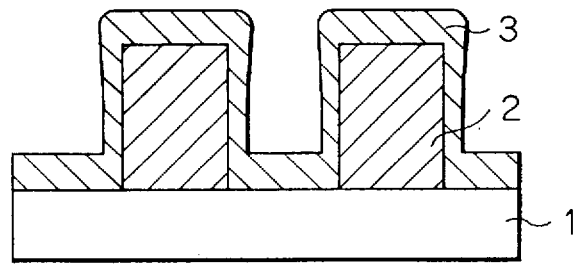

In FIG. 5B, a silicon oxide film 3 is deposited during a first rest interval Y in the first period. An etching effect due to the RF bias is not obtained during the rest interval Y. As a result, the deposition speed is kept at approximately 3000 to 4000 angstroms per one minute.

Figure 5C:
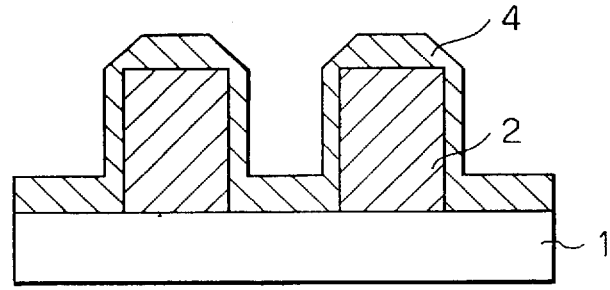
Figure 5D:
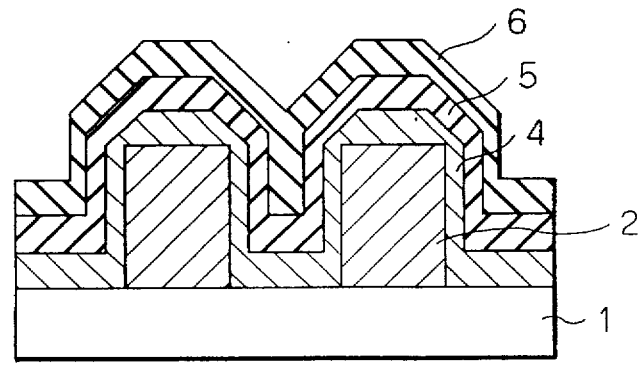

Next, in FIG. 5C, a silicon oxide film 4 is deposited during a first pulse interval X in the first period in FIG. 6. As mentioned before with respect to the conventional method of manufacturing a semiconductor device, edge portions of electric wirings are etched remarkably in the bias ECR-CVD deposition method. Therefore, an over hung configuration in the edge portions of electric wirings are rendered taper-shaped. Thereafter, such a deposition process is repeated three times to provide a semiconductor device illustrated in FIG. 5D. Namely, FIG. 5D shows a semiconductor device in which depositions over three periods of FIG. 6 are carried out. In FIG. 5D, a silicon oxide film 5 is deposited during a second pulse interval X in the second period while a silicon oxide film 6 is deposited during a third pulse interval X in the third period in FIG. 6. As clearly shown in FIG. 5D, silicon oxide films are deposited without forming a hollow between the electric wirings 2. An average deposition speed according to the invention is 1.4 to 1.8 times that of the above-mentioned conventional method of manufacturing a semiconductor device. This is because an etching effect is slowed when the RF bias output power is not applied. Since the RF bias is not continuously applied, the substrate 1 is not abnormally heated by plasma. Further, the relative dielectric constant is approximately 4.3 farad/meter in the silicon oxide film to which the RF bias is applied while approximately 3.8 in the silicon oxide film to which the RF bias is not applied. The average relative dielectric constant of a film deposited at one period can be reduced about 10 percent of that obtained by the continuous deposition.

Figure 7A:
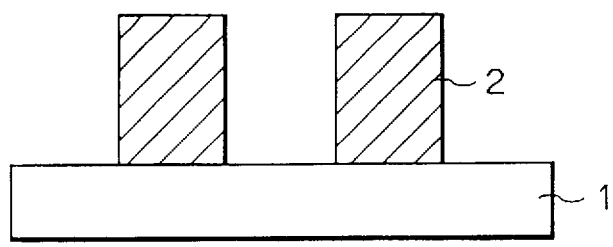
FIGS. 7A to 7D are views for describing a manufacturing process of a method of manufacturing a semiconductor device according to a second embodiment of the present invention.
Figure 7B:
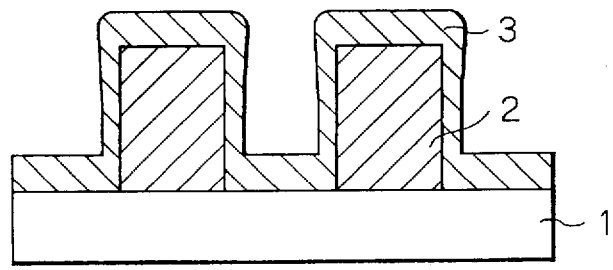
Figure 7C:
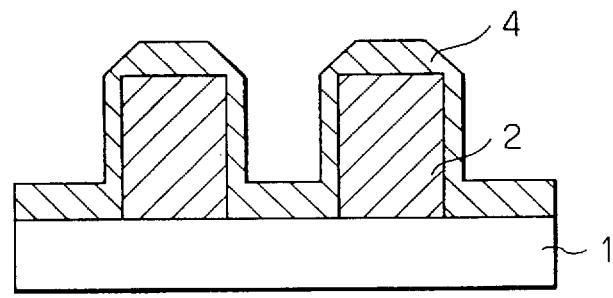
Figure 7D:
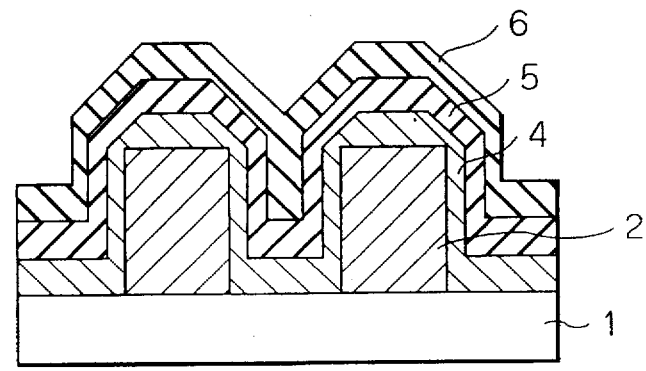
Figure 8:
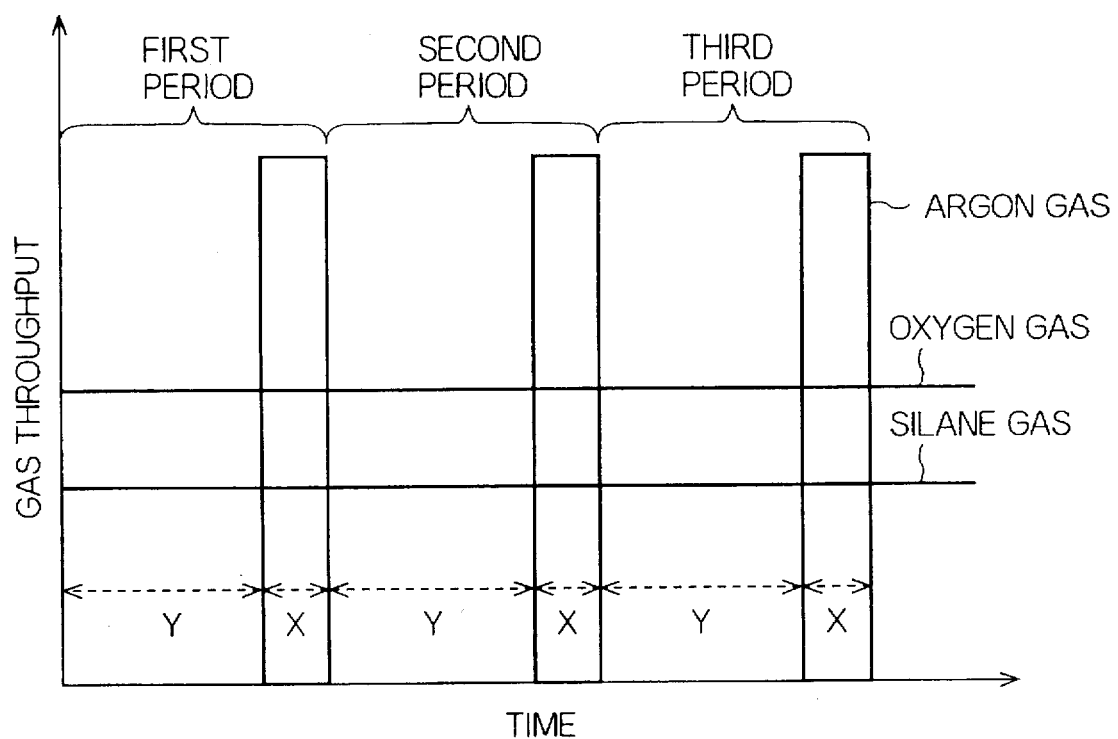
FIG. 8 is a graph for showing a relation between each throughput and supply time of silane, oxygen, and argon gas towards a substrate in the method of manufacturing the semiconductor device according to the second embodiment illustrated with reference to FIGS. 7A to 7D.
Figure 9:
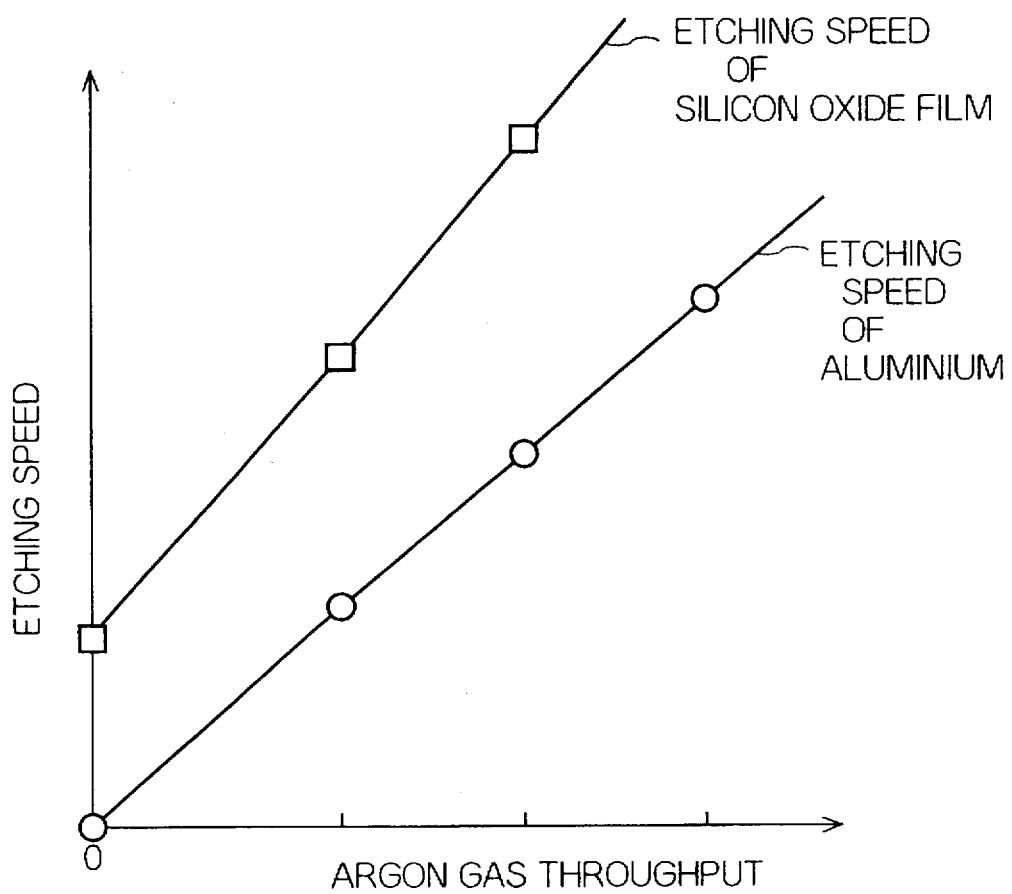
FIG. 9 is a graph for showing a relation between a throughput of argon gas and an etching speed of a silicon oxide film and an aluminium wiring.

Referring to FIGS. 7, 8 and 9, description proceeds to a method of manufacturing a semiconductor device according to a second embodiment of the present invention.

Similarly to the first embodiment, as shown in FIG. 7A, electric wirings 2 are formed on the substrate 1. An insulating film 3 is deposited on the electric wirings 2 by the bias ECR-CVD deposition method. Otherwise, the a bias ECR-CVD deposition apparatus is similar to that illustrated in FIG. 1 with respect to the conventional method of manufacturing a semiconductor device. The bias ECR-CVD deposition is carried out on the condition that a throughput of silane gas is 15 to 30 sccm, a throughput of oxygen is 23 to 45 sccm, a throughput of argon gas is 70 to 150 sccm, that an output power of the microwave is 2000 W, an output power of the RF bias is 1400 W to 3000 W, and that a deposition temperature is 300° C. to 350° C.

FIG. 8 shows a relation between each throughput and supply time of silane, oxygen, and argon gas towards a substrate in the method of manufacturing the semiconductor device according to the second embodiment.

As illustrated in FIG. 8, silane gas and gas are supplied to the plasma chamber 11 at a constant throughput from the beginning to the end of the deposition. On the other hand, argon gas is supplied thereto as a pulsed output, as shown in FIG. 8.

FIG. 9 shows a relation between a throughput of argon gas and an etching speed of a silicon oxide film and an aluminium wiring. As depicted in FIG. 9, the etching speed slows when no argon gas is supplied. As a result, the aluminium wiring is not etched, as shown in FIG. 9.

In FIG. 7B, a silicon oxide film 3 is deposited during a first rest interval Y in the first period, in which no argon gas is supplied. As mentioned before, deposition proceeds with a slow etching speed when no argon gas is supplied.

On the other hand, in FIG. 7C, a silicon oxide film 4 is deposited during a first pulse interval X in the first period in FIG. 8, in which argon gas is supplied. As mentioned before with respect to the conventional method of manufacturing a semiconductor device, edge portions of electric wirings are etched remarkably in the bias ECR-CVD deposition method. Therefore, an over hung configuration in the edge portions of electric wirings are rendered taper-shaped. Thereafter, such a deposition process is repeated three times to provide a semiconductor device illustrated in FIG. 7D. Namely, FIG. 7D shows a semiconductor device in which depositions over three periods of FIG. 8 are carried out. Each pulse interval X is from 0.3 seconds to 0.67 seconds provided that each rest interval Y is 1. When the pulse interval X exceeds 0.67 seconds, the edge portion of the electric wirings are etched unwillingly. On the other hand, when the pulse interval X does not reach 0.3, a hollow is inevitably produced between the electric wirings 2.

In FIG. 7D, a silicon oxide film 5 is deposited during a second pulse interval X in the second period while a silicon oxide film 6 is deposited during a third pulse interval X in the third period in FIG. 8. As clearly shown in FIG. 7D, silicon oxide films are deposited without forming a hollow between the electric wirings 2. The average deposition speed of this embodiment of the invention is 1.2 to 1.6 times that when argon gas is supplied thereto continuously. Since the argon gas is not continuously supplied, the substrate 1 is not abnormally heated by plasma.

As mentioned above, according to the first and the second embodiment of the present invention, minute wirings are formed rapidly without an etching of the wirings themselves. In addition, abnormal heating of the substrate 1 can be prevented by supplying the RF bias or the argon gas as a pulsed output power.

What is claimed is:

1. A method of manufacturing a semiconductor device having a multilayer interconnection structure, wherein silane gas, oxygen gas and argon gas are employed as deposition gases, said method comprising steps of:

forming a silicon oxide film on an electric wiring on a semiconductor substrate by plasma deposition;

said step of forming said silicon oxide film comprising steps of:

providing a first frequency wave of a constant value for producing plasma;

supplying a second frequency wave of a constant value onto said semiconductor substrate; and periodically supplying said argon gas during a pulse interval and, wherein said argon gas is not supplied during a rest interval.

2. A method of manufacturing a semiconductor device as in claim 1, wherein said first frequency wave comprises a microwave and said second frequency wave comprises a radio frequency ("RF") bias.

3. A method as in claim 2, wherein said microwave has a power of 2000 watts.

4. A method as in claim 2, wherein said RF bias has a power between 1400 watts and 3000 watts.

5. A method of manufacturing a semiconductor device as in claim 1, wherein said predetermined pulse interval is between 0.3 seconds and 0.67 seconds and said predetermined rest interval is 1.0 second.

6. A method as in claim 1, further comprising a step of supplying said silane gas at a throughput between 15 and 30 sccm.

7. A method as in claim 1, further comprising a step of supplying said oxygen gas at a throughput between 23 and 45 sccm.

8. A method as in claim 1, wherein said argon is supplied during said predetermined pulse interval at a throughput between 70 and 150 sccm.

9. A method as in claim 1, wherein said first frequency wave comprises a first high frequency wave and said second frequency wave comprises a second high frequency wave.

10. A method as in claim 1, further comprising a step of conducting said step of forming said silicon oxide film is performed at a temperature of 300° C. to 350° C.

11. A method as in claim 1, wherein said step of forming silicon dioxide comprises forming a layer of silicon dioxide at approximately 3000 to 4000 angstroms per minute.

12. A method as in claim 1, wherein said step of forming said silicon oxide film comprises covering said electrical wiring with silicon oxide and filling in gaps between said wiring with silicon oxide.

13. A method as in claim 12, wherein said step of periodically supplying said argon gas comprises a plurality of said pulse intervals and a plurality of said rest intervals.

14. A method as in claim 12, wherein said step of periodically supplying said argon gas includes three of said pulse intervals and three of said rest intervals.

15. A method as in claim 1, wherein said step of forming said silicon oxide film comprises completely filling gaps between said electrical wiring with silicon oxide.

* * * * *